United States Patent [19]

Sangyoji et al.

[11] Patent Number: 4,810,614

[45] Date of Patent: Mar. 7, 1989

[54] METHOD OF RECORDING INFORMATION ON PHOTOSENSITIVE AND PRESSURE-SENSITIVE SHEET UTILIZING MASK ORIGINAL FORM

[75] Inventors: Kazuo Sangyoji; Takemi Yamamoto, both of Nagoya; Tsugio Okamoto, Kani; Naoyuki Hatta, Gamagori; Yuji Asano, Nagoya; Kenji Sakakibara, Ichinomiya; Hitoshi Nakai, Nagoya; Michitoshi Akao, Nagoya; Jun Sakai, Nagoya; Yumio Matsumoto, Nagoya, all of Japan

[73] Assignee: Brother Kogyo Kabushiki Kaisha, Nagoya, Japan

[21] Appl. No.: 50,313

[22] Filed: May 14, 1987

[30] Foreign Application Priority Data

| May 19, 1986 | [JP] | Japan | 61-113872 |
| May 19, 1986 | [JP] | Japan | 61-113873 |
| May 19, 1986 | [JP] | Japan | 61-113876 |
| May 19, 1986 | [JP] | Japan | 61-113877 |
| Aug. 1, 1986 | [JP] | Japan | 61-182529 |
| Nov. 20, 1986 | [JP] | Japan | 61-277595 |

[51] Int. Cl.⁴ .................... G03C 1/72; G03C 5/54; G03C 5/16
[52] U.S. Cl. ..................... 430/138; 428/211; 428/402.2; 430/211; 430/235; 430/254
[58] Field of Search ............ 430/138, 254, 211, 235; 428/402.2, 211

[56] References Cited

U.S. PATENT DOCUMENTS

| 4,399,209 | 8/1983 | Sanders et al. | 430/211 |
| 4,440,846 | 4/1984 | Sanders et al. | 430/138 |
| 4,536,463 | 8/1985 | Sanders | 430/138 |
| 4,551,407 | 11/1985 | Sanders et al. | 430/211 |
| 4,622,282 | 11/1986 | Head et al. | 428/211 |
| 4,701,397 | 10/1987 | Rourke et al. | 430/138 |

*Primary Examiner*—Mukund J. Shah
*Attorney, Agent, or Firm*—Kane, Dalsimer, Sullivan, Kurucz, Levy, Eisele & Richard

[57] ABSTRACT

Disclosed is a method of recording a picture onto a photosensitive and pressure-sensitive paper, which comprises the steps of: forming in advance a mask original form of a film having a light-transmitting portion and a non-light-transmitting portion corresponding to information of the picture; exposing the photosensitive and pressure-sensitive paper through the mask original form to thereby form a latent image on the photosensitive and pressure-sensitive paper; and pressure-fixing the photosensitive and pressure-sensitive paper carrying the latent image formed thereon. Further disclosed is an apparatus for carrying out the above method, which comprises: a mask forming means for forming a mask original form of a film having a light-transmitting portion and a non-light-transmitting portion corresponding to picture information of an original picture; an exposure means for exposing the photosensitive and pressure-sensitive paper through the mask original form formed by the mask forming means; and a pressure-fixing means for pressing the photosensitive and pressure-sensitive paper having a latent image formed by the exposure means to thereby perform pressure-development.

11 Claims, 11 Drawing Sheets

FIG_10

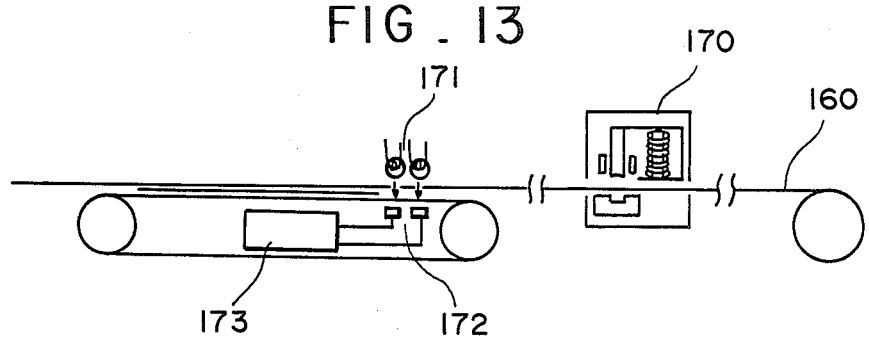
FIG_13
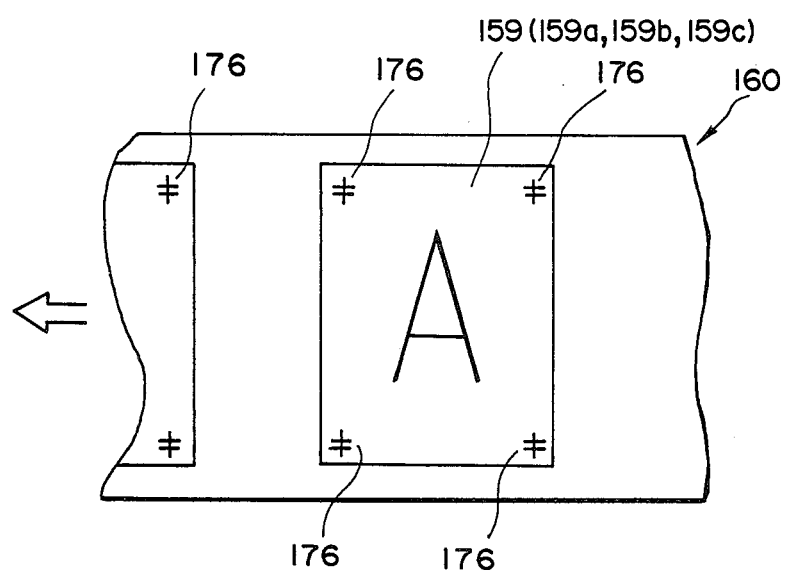
FIG_14

METHOD OF RECORDING INFORMATION ON PHOTOSENSITIVE AND PRESSURE-SENSITIVE SHEET UTILIZING MASK ORIGINAL FORM

BACKGROUND OF THE INVENTION

The present invention relates to a picture recording method for performing color or monochromatic picture recording from a color or monochromatic original and a picture recording apparatus for carrying out the method.

Generally known color picture recording apparatus include those of the silver salt photographic system, of the thermal transfer system, and of the electrophotographic system. Although being superior in picture quality, the silver salt photographic system is disadvantageous in that a long time is taken for the completion of a copy and the apparatus is expensive. The thermal transfer system is poor in picture quality and low in copying speed. Although being advantageous in that the picture quality is good and the copying speed is high, the electrophotographic system has a disadvantage in that the apparatus is expensive, and the inside of the apparatus gets dirty with toner powder to thereby increase the cost for maintenance.

Recently, photosensitive and pressure-sensitive recording paper suitable for recording paper or the like has been developed, for example, as disclosed in U.S. Pat. No. 4,440,846. The photosensitive and pressure-sensitive recording paper has microcapsules containing a coloring material, light-hardening resin, a light sensitizer, a light polymerization starting agent, etc., are applied on the surface thereof together with a developer agent for causing developing reaction with the coloring material in the microcapsules.

Conventionally, there have been following methods of recording picture information onto photosensitive and pressure-sensitive recording paper.

Method (1): A method in which scanning and exposing are performed directly on a photosensitive and pressure-sensitive paper by using light such as a laser which can be subject to switching.

Method (2): A method in which optical information is written on a photosensitive and pressure-sensitive paper through a microshutter, such as a liquid crystal shutter, disposed between the sheet and a continuously light emitting lamp.

However, there have been the following problems in those methods.

In the method (1), only a photosensitive and pressure-sensitive paper having a spectral sensitivity of 475 nm or less in wave length $\lambda$ can be manufactured at present. Accordingly, a selected one of an argon laser of a wave length $\lambda=351$ nm, a krypton laser of a wave length $\lambda=351$ nm, a helium and cadmium laser of a wave length $\lambda=325$ nm, and an ultraviolet gas laser has been used as the laser light source acting as the scanning and exposing means. However, all those lasers are large-sized and expensive.

In the method (2), when a liquid crystal shutter is used as a microshutter, the liquid crystal per se is deteriorated by ultraviolet rays.

In a copying apparatus in which the photosensitive and pressure-sensitive paper is used as copying paper, there are such advantages that the copying speed is made high because the exposure on the photosensitive and pressure-sensitive paper is rapidly completed and the maintenance is easy because toner powder is not used. The photosensitive and pressure-sensitive paper described above is of the so-called self coloring type. Other than the photosensitive and pressure-sensitive paper of the self coloring type, photosensitive and pressure-sensitive paper of the transfer type, as described in U.S. Pat. No. 4,399,209, has been developed. The photosensitive and pressure-sensitive paper of the transfer type is such that the developer agent is not applied to the recording paper but only the above-mentioned microcapsules are applied onto the surface of the recording paper and a transfer sheet having a developer agent applied thereon is separately prepared. After the photosensitive and pressure-sensitive paper is exposed, the transfer sheet is laminated on the photo-sensitive and pressure-sensitive paper and then the lamination is pressed, so that an image is developed on the transfer sheet. Accordingly, the photosensitive and pressure-sensitive paper of the transfer type has the same advantage as that of the recording paper of the self coloring type.

SUMMARY OF THE INVENTION

It is therefore a primary object of the present invention to provide a picture recording method using a photosensitive and pressure-sensitive paper, in which picture formation is performed through an intermediate film mask having a picture formed thereon in advance.

It is another object of the present invention to provide a picture recording apparatus using a photosensitive and pressure-sensitive paper, in which picture formation is performed through an intermediate film mask having a picture formed thereon in advance.

It is a further object of the present invention to provide a picture recording apparatus using a photosensitive and pressure-sensitive paper, in which picture quality and resolution and color reproducibility are improved.

It is a still further object of the present invention to provide a picture recording apparatus using a photosensitive and pressure-sensitive paper, in which color picture formation is enabled to be carried out by using one kind of toners, ink or the like.

It is another object of the present invention to provide a picture recording apparatus using a photosensitive and pressure-sensitive paper, in which not only the formation of an intermediate film mask having a picture formed thereon in advance can be carried out easily and for a short time but the mask can be preserved.

In order to attain the objects, according to a first aspect of the present invention, the method of recording a picture onto a photosensitive and pressure-sensitive paper comprises the steps of forming in advance a mask original form of a film having a light-transmitting portion and a non-light transmitting portion corresponding to information of the picture; exposing the photosensitive and pressure-sensitive paper through the mask original form to thereby form a latent image on the photosensitive and pressure-sensitive paper; and pressure-fixing the photosensitive and pressure-sensitive paper carrying the latent image formed thereon.

According to the second aspect of the present invention, the apparatus for carrying out the above method comprises a mask forming means for forming a mask original form of a film having a light-transmitting portion and a non-light-transmitting portion corresponding to picture information of an original picture; an exposure means for exposing the photosensitive and pressure-sensitive paper through the mask original form formed by the mask forming means; and a pressure-fixing means for pressing the photosensitive and pressure-sensitive paper having a latent image formed by the exposure means to thereby perform pressure-development.

BRIEF DESCRIPTION OF THE DRAWINGS

The above and other objects, features, and advantages of the present invention will be more apparent from the following description with reference to the accompanying drawings, in which:

FIG. 13 is a diagram for explaining the positioning mechanism for stopping a positive mask original form in place;

FIG. 14 is a diagram for explaining another positioning means for stopping a positive-film original form in place.

DETAILED DESCRIPTION OF PREFERRED EMBODIMENTS

Figure 1:
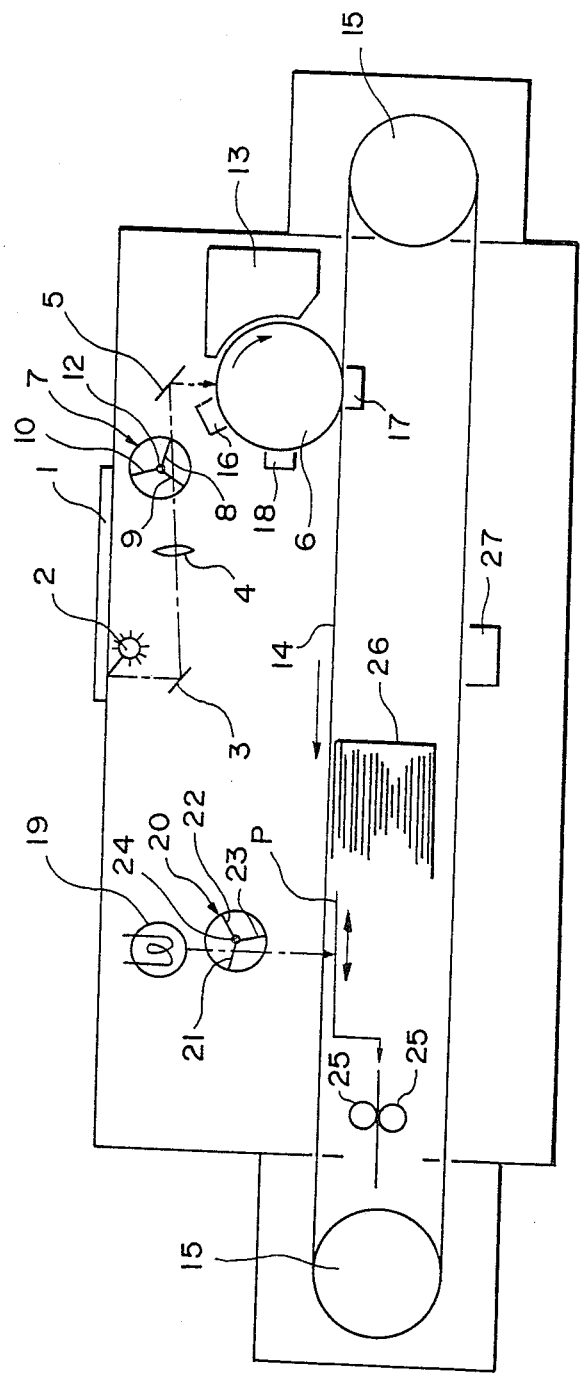
FIG. 1 is a schematic diagram of a first embodiment of the color picture recording apparatus according to the present invention.

Referring to the drawings, the present invention will be described in detail.

Figure 2:
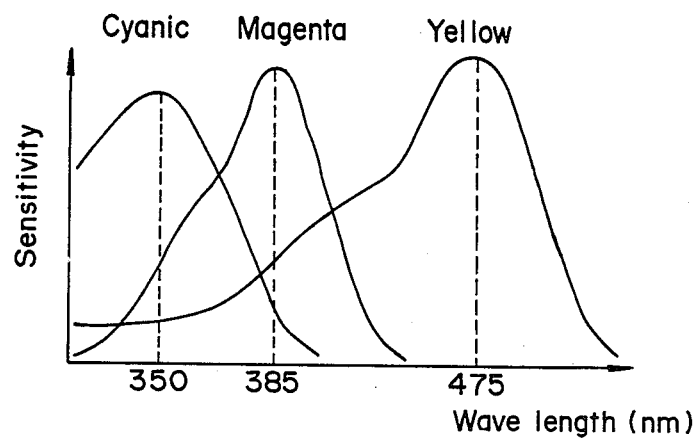
FIG. 2 is an explanatory diagram showing the spectral sensitivity characteristics of the photosensitive and pressure-sensitive paper.
Figure 3:
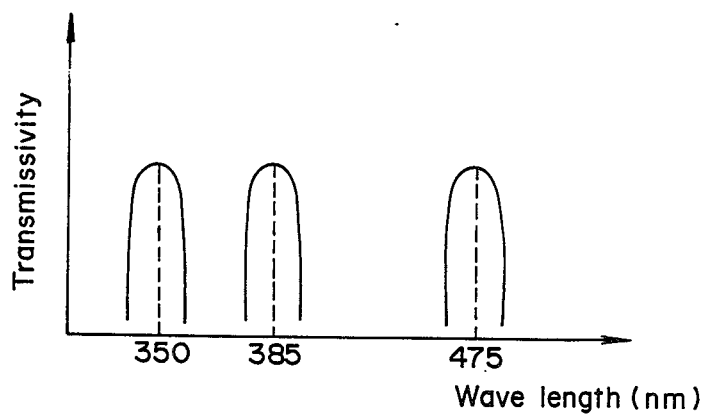
FIG. 3 is an explanatory diagram showing the spectral transmittivity of the spectro-filter.

Referring to FIGS. 1 through 3, a first embodiment according to the present invention will be described hereunder.

FIG. 1 shows a picture recording apparatus for realizing the method according to the present invention, in which the reference numeral 1 designates a color original, 2 designates a visible light source disposed to be opposite to the picture of the color original. The light radiated from the visible light source 2 onto the picture on the color original document 1 is reflected thereon and the reflection light is caused to impinge onto the surface of a photosensitive drum 6 through a reflection mirror 3, an optical lens 4, and a reflection mirror 5. The photosensitive drum 6 is formed such that a photosensitive film made of, for example, a layer of selenium or a selenium-tellurium alloy is deposited through evaporation on the surface of a drum-shaped substrate of a conductive material such as aluminum, the photosensitive drum being arranged to be rotated in the direction indicated by an arrow in FIG. 1. The reference numeral 7 designates a visible radiation spectro-filter disposed in an optical system located between the optical lens 4 and the reflection mirror 5. The visible radiation spectro-filter 7 is constituted by a red filter 8 for transmitting only red light, a green filter 9 for transmitting only green light, and a blue filter 10 for transmitting only blue light. Those filters 8, 9, and 10 are provided so as to radially extend around a rotary shaft 12. The reference numeral 13 designates a toner developing device disposed in opposition to the photosensitive drum 6, and only one kind of toners, that is, black toners are provided in the toner developing device 13. The reference numeral 14 is a sheet-like ultraviolet-light transmitting film which is endlessly stretched between rolls 15 and 15 and arranged so as to be moved at the same constant speed as the rotating peripheral speed of the photosensitive drum 6 in the direction indicated by the arrow in the drawing, the ultraviolet-light transmitting film 14 being made to come near the opposing surface of the photosensitive drum 6 on the way of movement. The reference numeral 16 designates a corotron provided in opposition to the photosensitive drum 6 at a position on this side with respect to the rotating direction from a point where the photosensitive drum is irradiated with the reflection light for charging the photosensitive drum 6 to thereby attach the black toners onto the surface of the photosensitive drum 6, the reference numeral 17 designates another corotron provided in opposition to the photosensitive drum 6 with the ultraviolet-light transmitting film 14 sandwiched therebetween for transferring the black toners on the surface of the photosensitive drum 6 and constituting mask original form onto the ultraviolet-light transmitting film 14, and the reference numeral 18 designates a discharge device for discharging the photosensitive drum 6 after the black toners on the surface of the photosensitive drum 6 have been transferred onto the ultraviolet-light transmitting film 14. A copying portion is provided at a position on this side with respect to the moving direction of the ultraviolet-light transmitting film 14, so that photosensitive and pressure-sensitive paper P can be set under the mask original form of the ultraviolet-light transmitting film 14 at the copying portion as shown in FIG. 1. Further, an ultraviolet-light source 19 is disposed above the photosensitive and pressure-sensitive paper P, and an ultraviolet-light spectro-filter 20 is disposed in an optical system of ultraviolet light between the ultraviolet-light source 19 and the ultraviolet-light transmitting film 14. In this case, the above-mentioned photosensitive and pressure-sensitive paper P may be known photosensitive and pressure-sensitive paper carrying on its surface a sensitizer composed of microcapsules separately containing coloring basic materials primary cyanic, magenta, and yellow colors for use for color printing. FIG. 2 shows the spectral sensitivity characteristics of the above-mentioned photosensitive and pressure-sensitive paper P. It is known that the respective peak sensitivities of cyanic, magenta, and yellow colors exist at the wave-lengths of 350 nm, 385 nm, and 475 nm. Accordingly, the ultraviolet-light spectro-filter 20 is constituted by an interference filter 21 for the cyanic color for transmitting only the light of the wave-length of 350 nm as shown in FIG. 3 so as to make the cyanic coloring basic material harden by light, another interference filter 22 for the magenta color for transmitting only the light of the wave-length of 385 nm so as to make the magenta coloring basic material harden by light, and a further interference filter 23 for the yellow color for transmitting only the light of the wave-length of 475 nm so as to make the yellow coloring basic material harden by light, as shown in FIG. 3, the filters 21, 22, and 23 being arranged to radially extend around the rotary shaft 24. In the drawing, the reference numerals 25 and 25 designate a pair of heat fixing rolls, 26 designates a storage/feed portion for the photosensitive and pressure-sensitive paper p, and 27 designates a cleaner for sweeping off the black toners on the ultraviolet-light transmitting film 14 after the photosensitive and pressure-sensitive paper P has been subject to exposure processing.

When a color picture is copied by using the thus arranged color picture recording apparatus, the red filter 8, the green filter 9, and the blue filter 10 constituting the visible radiation spectro-filter 7 are successively set one after one so that the reflection light from the color original 1 irradiated with light from the visible light source 2 is transmitted separately successively through the filters 8, 9, and 10 to thereby form electrostatic latent images on the surface of the photosensitive drum 6 by the respective light transmitted successively through the filters, 8, 9, and 10. The thus formed electrostatic latent images are developed by the toner developing device 13 and transferred onto the ultraviolet-light transmitting film 14. In this case, only the red light can be transmitted through the red filter 8, and therefore a portion of the photosensitive drum 6 other than the portion of the same irradiated with the red light is kept in a charged state so that the black toners are made to adhere onto only the charged portion of the photosensitive body 6 and then transferred onto the ultraviolet-light transmitting film 14 with only the portion corresponding to the red light kept blank. In the case of the green filter 9, the black toners are transferred onto the ultraviolet-light transmitting film 14 with only the portion corresponding to the green light kept blank, and in the case of the blue filter 10, the black toners are transferred onto the ultraviolet-light transmitting film 14 with only the portion corresponding to the blue light kept blank. The mask original form of the ultraviolet-light transmitting film 14 on which the black toners have been transferred in such a manner as described above is advanced so that ultraviolet-light is radiated from the ultraviolet light source 19 first when the portion of the film where the black toners have been transferred by the use of the red filter 8 is superimposed on the photosensitive and pressure-sensitive paper P. At that time, the ultraviolet-light spectro-filter 20 is set to the interference filter 21 so that only the light of the wave-length of 350 nm can be transmitted through the cyanic interference filter 21. In this manner, the transmitted light passes through the portion of the ultraviolet-light transmitting film 14 where no toners are attached and makes a light-hardening reaction only with the cyanic coloring basic material on the photosensitive and pressure-sensitive paper P to thereby expose only the portion of the photosensitive and pressure-sensitive paper P. At that time, it is a matter of course that the photosensitive and pressure-sensitive paper P is moved together with the mask original form of the ultraviolet-light transmitting film 14 at the same speed with each other. Thus, upon completion of exposure onto the portion of the ultraviolet-light transmitting film 14 corresponding to the red filter 8, the photosensitive and pressure-sensitive paper P is caused to come back to the initial position and another portion of the mask of the ultraviolet-light transmitting film 14 corresponding to the succeeding green filter 9 is superimposed on the photosensitive and pressure-sensitive paper P so as to be irradiated with ultraviolet-light from the ultraviolet-light source 19. At that time, the ultraviolet-light spectro-filter 22 is set to the magenta interference filter 20 so that only the magenta coloring basic material on the photosensitive and pressure-sensitive paper P is subject to light-hardening reaction to thereby be exposed. Similarly to this, the yellow interference-filter 23 is set and the yellow coloring basic material on the photosensitive and pressure-sensitive paper P is subject to light hardening reaction to thereby expose the portion corresponding to the blue filter 10. After completion of exposure processing for the respective cyanic, magenta and yellow primary colors in such a manner as described above, the photosensitive and pressure-sensitive paper P is made to pass through a nip between the heat fixing rolls 25 and 25, so that the microcapsules of coloring basic materials which have not been hardened by light are broken, thereby performing coloring fixing processing of the photosensitive and pressure-sensitive paper P. In this connection, a red color presents due to synthesis of the magenta and cyanic colors on the photosensitive and pressure-sensitive paper P at a portion where only the cyanic coloring basic material is hardened by light, a green color presents at a portion where only the magenta coloring basic material is hardened by light, and a blue color presents at a portion where only the yellow coloring basic material is hardened by light, so that color picture recording with desired colors can be performed. Upon completion of the copying operation, the black toners on the ultraviolet-light transmitting film 14 are removed and used repeatedly.

Thus, the embodiment has been illustrated as to the case in which the photosensitive and pressure-sensitive paper P having the three kinds of coloring basic materials for cyanic, magenta, and yellow colors are used, in which three kinds of color filters, that is, red, green and blue filters, are used as the visible radiation spectro-filter, and in which the three kinds of light transmitting films 14 are formed. The present invention, however, is not limited to that case, but applicable to the case where picture recording of two colors and of four colors or more is carried out. For example, an interference filter for transmitting light of all the wave-lengths is additionally provided in the above-mentioned spectro-filter, so as to perform black and red color picture recording by using the interference filter and the red filter. Further, various kinds of photosensitive paper having various coloring basic materials are known and it is possible to realize multicolor picture recording by using suitably selected one of the known paper.

Referring to the drawings, a second embodiment of the color picture recording apparatus for forming a color picture according to the present invention will be described hereunder.

Figure 4:
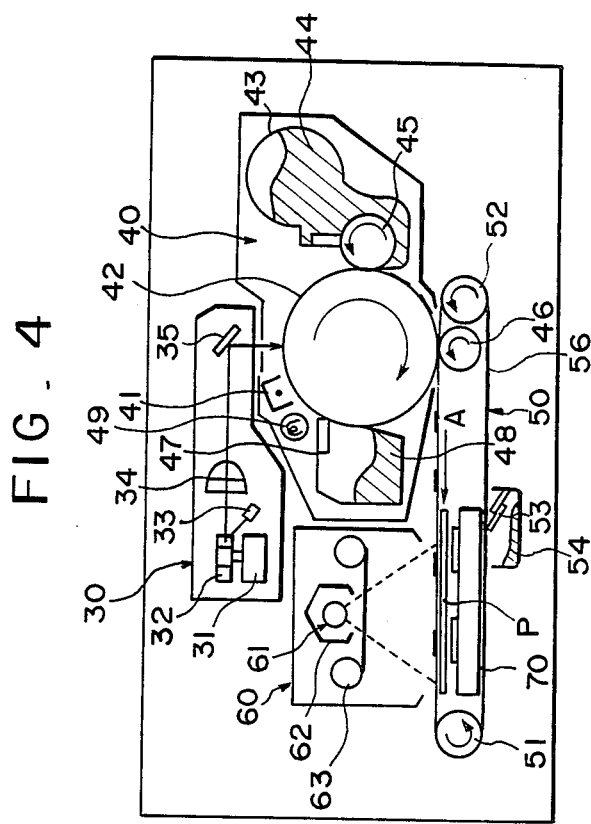
FIG. 4 is a cross section showing a second embodiment of the present invention.

Referring to FIG. 4, the color picture recording apparatus is constituted by a laser scanner unit 30, an electrophotographic unit 40, a transmission member transporting unit 50, an exposure unit 60, a photosensitive and pressure-sensitive paper feeding unit 70, a pressure fixing unit 80, etc.

The laser scanner unit 30 constitutes a latent image forming means for forming a latent image on the basis of a picture information on a photosensitive drum 52 as will be described later, and the laser scanner unit 30 is constituted by an electric motor 31, a polygonal mirror 32 arranged to be rotated by the motor 31, a semiconductor laser 33 for radiating laser light onto the polygonal mirror 32, an f$\theta$ lens 34, and a plane mirror 35 for causing the laser light to reach the photo-sensitive drum 42.

The photosensitive drum 42 having a spectral sensitivity intensified to a range of infrared rays of about 800 nm, which has become possible to be easily manufactured recently. Accordingly, as the semiconductor laser 33, a small-sized and inexpensive one of a small rated power of several mW can be used. The laser scanner unit 30 scans the surface of the photosensitive drum 42 at a high speed with a light signal which is converted from digital picture data by a not-shown controller unit based on character or picture information. Such a technique has been well known and has been used in optical systems in many laser printers on the market, and therefore the detailed description as to the operation thereof will be omitted.

The electrophotographic unit 40 constitutes an application means for applying a shading material onto a latent image formed on the photosensitive drum 42, and is constituted by the photosensitive drum 42 acting as a photosensitive body, toners 44 acting as the shading material, a toner casing 43 for accommodating the toners 44, a developing sleeve 45 for making the toners 44 adhere to the photosensitive drum 42, a transfer roller 46 for transferring the toners 44 attached on the photosensitive drum 42 onto a transparent insulating film 56 (hereinafter referred to as "a film") which will be described later, a cleaning member 47 for collecting the residual toners 44 on the photosensitive drum 42 after the transfer onto the film 56, a collected-toner casing 48 for accommodating the collected toners 44, an eraser lamp 49 for removing the residual charge of the photosensitive drum 42, and a charger corotron 41 for uniformly charging the photosensitive drum 42.

After uniformly charged by the charger corotron 41, the photosensitive drum 42 receives the laser light radiated from the laser scanner unit 30 only at the picture portion of the photosensitive drum 42 (exposure) so that an electrostatic latent image is formed there. In the embodiment, one component black toners 44 are accommodated in the toner casing 43 and are uniformly applied onto the developing sleeve 45, so that the latent image on the photosensitive drum 42 is developed. In that case, being charged in the same polarity as the charges at the non-exposed portion of the latent image, the toners 44 adhere to the exposed portion on the drum owing to the electrostatic repulsion force. This is the reversal development in which toners is made to adhere to an exposed portion. Alternatively, the process may be attained through positive transfer, in which the outside region of a picture is exposed. A high voltage having a polarity different from that of the toners is being applied to the transfer roller 26 from a not-shown high-voltage power source.

The not-transferred toner remained on the drum is collected from the drum by the cleaning member 47 and the residual electric charges on the drum are exposed and erased by the eraser lamp 49.

The transmission member transporting unit 50 is constituted by a pair of driving and driven rollers 51 and 52 for transporting the film 56, an electric motor (not shown) for driving the driving roller 51 and for stopping the film 56 at a predetermined position, a cleaning blade 53 for collecting the toners 46 transferred on the film 56, a collected-toner casing 54 for accommodating the collected toners 44, and the like. The film 56 is made of polyethylene terephthalate (PET), has a softness, is about 70 through 200 nm thick, and has permeability for light having a wave length which is at least longer than the wave length $\lambda = 350$ nm.

Figure 5:
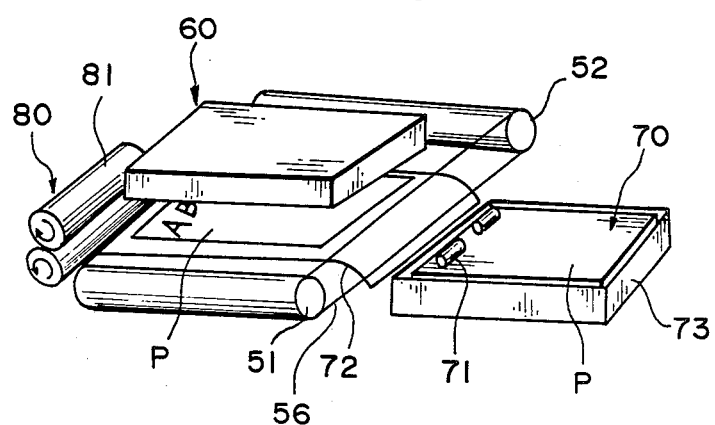
FIG. 5 is a perspective view showing the main parts including the photosensitive and pressure-sensitive paper feed portion and the transmission member feed portion in the embodiment.

As shown in FIG. 5, the photosensitive and pressure-sensitive paper feeding unit 70 is constituted by a paper-feed cassette 73 for accommodating the paper P, paper-feed rollers 71 for taking out the paper from the paper-feed cassette 73, a paper guiding portion 72 for guiding the paper fed from the paper-feed roller 71, and so on. The paper guiding portion 72 is disposed under the film 56 so that the paper S can be located just under the film 56 (referred to as "an exposure station"), and the paper guiding portion 72 is arranged to be able to guide the paper S to a nip between a pair of pressure rollers 81.

In the embodiment, the paper S is prepared for color printing and has microcapsules applied on its surface, the microcapsules separately containing a coloring material of cyanic, magenta, and yellow basic colors. The spectral sensitivity characteristic of the paper S, for example, has peak sensitivities of cyanic, magenta, and yellow colors at the wave length $\lambda = 350$ nm, at the wave length $\lambda = 385$ nm, and at the wave length $\lambda = 470$ nm, respectively, as shown in FIG. 2.

Figure 6:
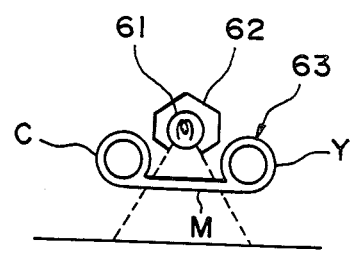
FIG. 6 is a cross section showing the main part of the exposure device.

As shown in FIG. 6, the exposure unit 60 is constituted by an exposure lamp 61, a reflector 62 for reflecting a light radiated from the exposure lamp 61 toward the film 56, a filter unit 63 incorporating interference filters for individually transmitting only the light having the respective wave lengths corresponding to cyanic, magenta and yellow colors so as to selectively light-harden the respective coloring materials for the cyanic, magenta, and yellow colors, and so on.

In that case, when a predetermined color is recorded on the paper P, the filter unit 63 suitably selects one of the cyanic filter C, the magenta filter M, and the yellow filter Y by a suitable means. In that case, the exposure lamp 61 is desirable to have a wide wave length band from the ultraviolet region in the vicinity of the wave length $\lambda = 300$ nm to the visible radiation region, and, for example, a xenon lamp is applicable to the desirable lamp.

The pressure fixing unit 80 is used to crush nonexposed microcapsules so as to record a picture on the paper with a dye flowing out of the microcapsules, and is constituted by a pair of pressure rollers 81, a not-shown sheet feeding member, and so on.

The operation of the embodiment will be described hereunder.

First, a picture of a magenta color is formed on the paper P. The scanner unit 30 radiates laser light only onto a portion to be magenta-colored on the photosensitive drum 42. The electrophotographic unit 40 transfers black toners onto a portion to be magenta-colored on the film 56. The film 56 having the toners transferred thereto becomes a positive mask of a magenta color. The film 56 is then moved to be put on the paper P and exposed by the exposure lamp 61. In that case, the filter unit 63 puts the magenta interference filter M for transmitting only the light in the vicinity of the wave length $\lambda = 385$ nm in the optical path. Accordingly, only the magenta microcapsules on the paper are subject to light-hardening reaction. The microcapsules which have not been irradiated with the light of the wave length λ=385 nm owing to the existence of the black toners put on the portion to be magenta-colored on the film 56 are not subject to the light-hardening reaction but generates coloring reaction when they are pressed by the pressure rollers 81 together with the sheet, so that a picture of a magenta color is formed on the sheet.

Respective pictures of the yellow and cyanic colors are also successively formed in the same manner. The filter unit 63 successively puts the yellow and cyanic filters Y and C into the optical path, the electrophotographic unit 40 successively forms positive masks of the respective yellow and cyanic colors on the film 56, and the exposure lamp 61 successively exposes the film 56 for the respective yellow and cyanic colors. Then, the same process at that has been performed in forming the magenta picture on the paper is carried out for the respective yellow and cyanic colors. The film 56 is kept stationary when the paper P is exposed. At that time, the paper P is transported from the paper-feed cassette to the exposure station by the paper-feed rollers 71 and the paper-guiding portion 72, and stops when it comes into slight close contact with a not-shown pressing plate.

While the exposure with the three, cyanic, magenta and yellow, primary colors yellow are successively performed, the paper P remains stationary. On the other hand, the positive mask of every color formed on the film 56 by the electrophotographic unit 40 is moved in the direction shown by an arrow A in FIG. 4 and stopped at a predetermined position so as to be exposed for every color.

The exposed paper P is then passed through a nip between the pair of pressure rollers 81 by feed rollers, so that the microcapsules to generate color are crushed owing to the pressure so as to generate color on the sheet by means of the coloring material contained in the capsules.

After the toner image on the film 56 has been used as a mask, the film is moved in the direction shown by the arrow A and the residual toners are cleaned from the surface of the film by the cleaning blade 53 so as to be collected. Toners are transferred to the film 56 so that the film 56 is used again as a mask original form.

In the embodiment described above, the development on the photosensitive drum 42 is performed by using only one color of black toners when a color picture is formed, and therefore exposure light amount adjustment and development bias control agreed with the development characteristic of toners of the respective colors which have been performed in the color laser printer of the electrophotographic system become unnecessary, and it is not necessary to perform correction of the gradation and color tone.

Accordingly, in the color picture recording apparatus of this embodiment, the electrophotographic process unit is simple in structure compared with the electrophotographic system of forming a color picture, and therefore the apparatus can be made small in size, the cost can be reduced, and the reliability can be improved.

Further, the exposure system in the embodiment can be performed with less light energy compared with the conventional exposure system in which the laser light is directly used to expose and scan the paper. That is, in this embodiment, the light energy necessary for the exposure, that is, for the sum of the laser exposure for the photosensitive drum and the uniform exposure for the paper P, is only from several ten W to about 100 W at the utmost. The exposure device can be simplified and miniaturized owing to the use of a semiconductor laser in the scanner. In the photosensitive and pressure-sensitive paper developing and fixing process, the thermal transfer toners used in the conventional electrophotographic system becomes unnecessary, so that the consumption of electric power can be much reduced.

Although the embodiment has been described as to the color laser printer by way example, the invention is not limited to this picture recording system, but, for example, an LED array or a device in which a fluorescent lamp is combined with a liquid crystal shutter may be used in place of the laser scanner in the system in which a visible image is produced by the electrophotographic system.

Further, the color picture recording apparatus according to the present invention can be used as a monochromatic printer instead of the color printer, if photosensitive and pressure-sensitive paper provided with monochromatic microcapsules containing a coloring material for black color, or the primary color such a yellow color, a magenta color, a cyanic color, or the like.

As the exposure lamp for the paper P, fluorescent lamps respectively having peaks at the wave lengths λ=350, 385, and 470 nm may be separately used instead of the xenon lamp.

Figure 7:
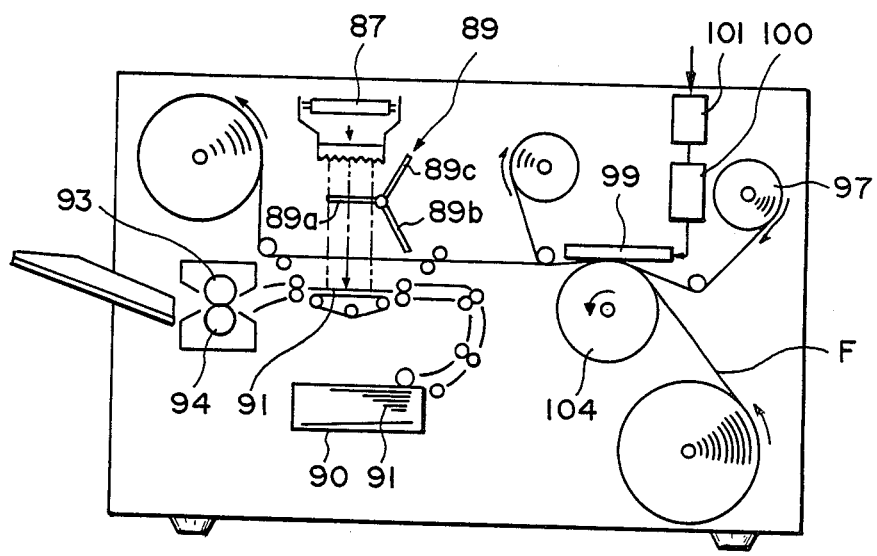
FIG. 7 is a schematic diagram showing a third embodiment of the present invention.
Figure 8:
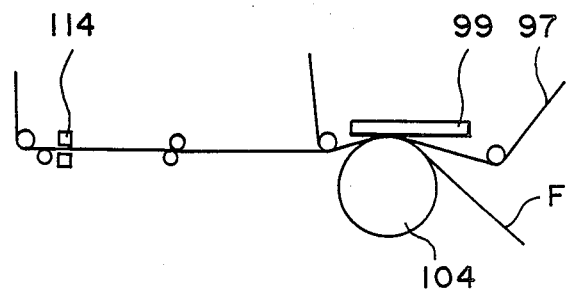
FIGS. 8 and 9 are diagrams for explaining the device for positioning the transparent film as mask original form.
Figure 9:
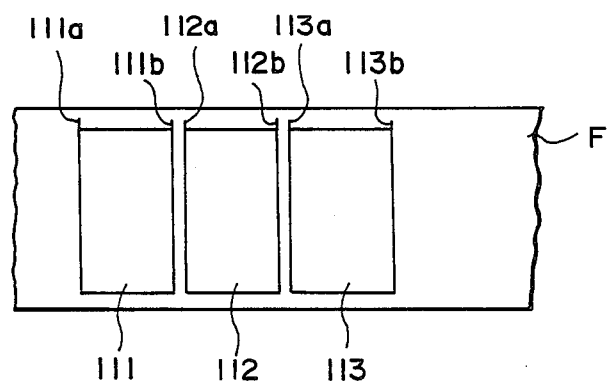

FIG. 7 shows a third embodiment for realizing the color picture recording apparatus according to the present invention. In a color picture recording apparatus, generally, an output device or a reading mechanism takes in respective image data for colors, red, green and blue, separately from one another from a color original so as to copy the color original on the basis of the taken-in image data. However, the description as to such an input device will be omitted in order to facilitate the description. Of the thus taken-in color image data, first, red image data is transferred to a thermal head 99 through a data input portion 101 and a control portion 100 so that the data are transferred with ink (black) of a thermal transfer ribbon 97 onto a transparent film F sandwiched between the thermal head 99 and a platen 104 disposed in opposition to the thermal head 99. Similarly to this, green image data are also transferred by the thermal head 99 onto the transparent film F at a portion separated right by a fixed pitch from the transfer portion of the red image data. Similarly, the blue image data are also transferred/printed onto the transparent film F. After those three kinds of red, green, and blue image data have been individually monochromatically transferred onto the transparent film F in such a manner as described above, the mask original forms are fed left in the drawing and stopped so that the first red original form is located at a position directly under a light source 87. Photosensitive and pressure-sensitive paper 91 carrying color couplers for cyanic, magenta, and yellow colors applied thereon is drawn out of a blank-form cassette 90 so as to be disposed under the original forms of the transparent film F with the photosensitive surface of the paper faced the original forms, and the paper is irradiated with light flux radiated from the light source 87 through a first filter portion 19a of a filter 89 for transmitting only light of a wave length of 350 nm corresponding to 350 nm of the cyanic spectral peak sensitivity and through the red mask original form so that cyanic microcapsules of the photosensitive and pressure-sensitive paper 91 are photosensitized and hardened. The transparent film F is fed left by the fixed pitch to move the green mask form to a position directly above the photosensitive and pressure-sensitive paper 91, the filter 89 is rotated to a second filter portion 89b for transmitting only light of a wave length of 385 nm corresponding to 385 nm of magenta spectral peak sensitivity, and light flux of the light source 87 is passed through the second filter portion 89b and the green mask original form, so that magenta microcapsules are selectively photosensitized and hardened in accordance with the image data. At last, the light flux of the light source 87 is passed through a third filter portion 89c for transmitting only light of a wave length of 475 nm correspondent to 475 nm of yellow spectral peak sensitivity and through the blue mask original form, so that yellow microcapsules on the photosensitive pressure-sensitive paper 91 are selectively photosensitized and hardened. Thus, after photosensitized through the three, red, green, and blue mask original forms, the sheet of photosensitive and pressure-sensitive paper 91 is fed to a nip between a pressure fixing roll 93 and a counter roll 94 so as to be subject to fixing with pressure. Non-hardened microcapsules are broken through the pressure fixing and mixed with a developer, so that the respective colors are generated to reproduce the color original. Desirably, the transparent film F of about 50 μm thick is made of a polyester film having high transparency. In the thermal transfer ribbon 97, a PET of about 6 μm thick used for general thermal transfer printers is employed as a base film. The positioning of the three kinds of mask original forms of the transparent film F relative to the photosensitive and pressure-sensitive paper 91 is very important. As shown in FIGS. 8 and 9, start lines 111a, 112a, and 113a and end lines 111b, 112b, and 113b for respective image data frames 111, 112, and 113 for red, green, and blue are printed by the thermal head 99, and the start lines 111a, 112a, and 113a are successively sensed by a photosensor 114 so that the respective positions of the mask original forms are successively determined.

Figure 10:
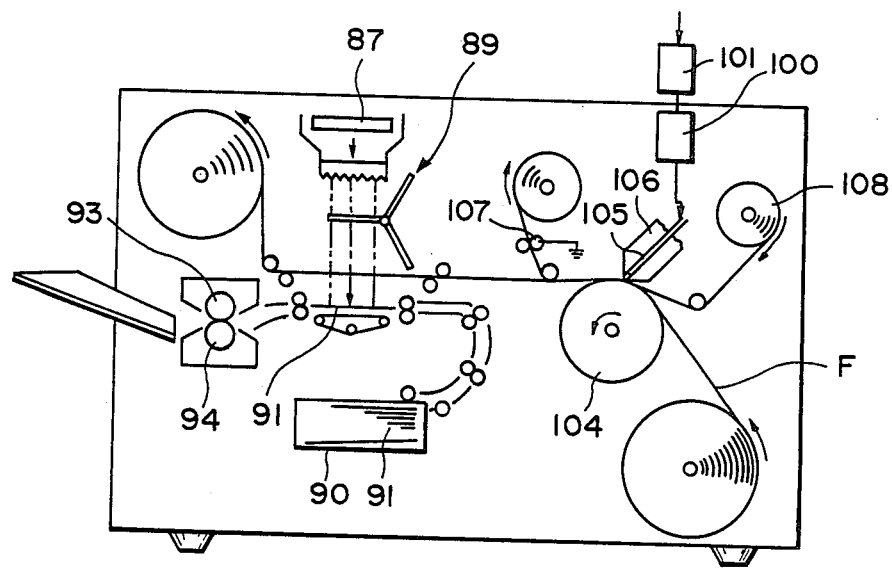
FIG. 10 is a schematic diagram showing a fourth embodiment of the present invention.

FIG. 10 shows a forth embodiment according to the present invention, in which image data are transferred/printed on a transparent film F by means of a current conduction system instead of the use of the thermal head. That is, a current is caused to selectively flow from a current-conduction electrode 105 of an electrode head 106 to a current-conduction ribbon 108 on the basis of input data, so that image data are formed on the transparent film F. The current caused to flow in the current-conduction ribbon 108 is collected through a return electrode 107. The point that three kinds of red, green, and blue mask original forms are formed in the manner as described above and subject to irradiation exposure together with a filter 89 is the same as in the system of the third embodiment. In view of printing quality, it seems that more clear printing quality can be obtained in the current-conduction system because the current-conduction system is superior in heat efficiency to the thermal head system. In order to save electric power, it is desirable that exposure and printing are not simultaneously carried out. That is, desirably, for example, the exposure by the light source is effected prior to the start of printing of the green image data which is carried out with an interval of fixed pitch after the printing of the red image data by the use a thermal head.

Figure 11:
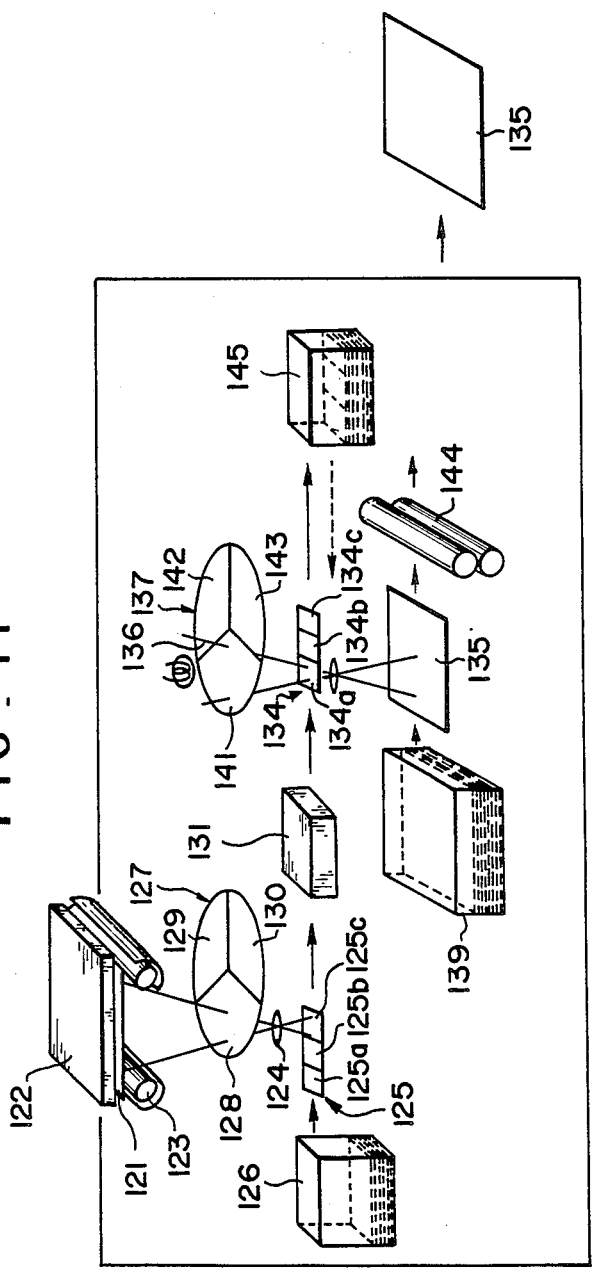
FIG. 11 is a schematic diagram showing a fifth embodiment of the picture recording apparatus according to the present invention.

Referring to FIG. 11, a fifth embodiment according to the present invention will be described hereunder.

The drawing shows a color copying device, in which the reference numeral 121 designates an original, 122 an original pressing cover, and 123 a visible-radiation source provided to be opposite to a picture surface of the original 121. The arrangement is made such that the light radiated from the visible radiation source 123 onto the picture surface of the original 1 is reflected at the picture surface and the reflected light is caused to impinge onto a film 125 for making original forms through an optical lens 124. The mask original form forming film 125 has such features that the film has photosensitive property and after exposure the exposed portion is made to have light-transmitting property through predetermined developing and fixing processing. A developing and fixing device 11 to be used to carry out the above developing and fixing processing and the technique per se are known, for example, as taught by a film and a slide forming machine made by Polaroid Corporation and available on the market. The mask original form forming film 125 is fed from a film stacker 126. The reference numeral 127 designates a visible radiation spectro-filter provided in an optical system disposed between the optical lens 124 and the original 121. The visible radiation spectro-filter 127 is constituted by a red filter 128 for transmitting only red light, a green filter 129 for transmitting only green light, and a blue filter 130 for transmitting only blue light. Arrangement is made such that photosensitive and pressure-sensitive paper 135 can be set under a mask original form carrying film 134 which has been sensitized by the visible radiation source 123 and which has been subject to predetermined processing through the developing and fixing device 131. A light source 136 is provided above the photosensitive and pressure-sensitive paper 135 and a spectro-filter 137 is provided in an optical system between the light source 136 and the mask original form carrying film 134, so that the photosensitive and pressure-sensitive paper 135 is irradiated with the light passed through the spectro-filter 137 through an optical lens 138. The photosensitive and pressure-sensitive paper 135 is fed from a paper stacker 139. In that case, for the photosensitive and pressure-sensitive paper 135, used is known photosensitive and pressure-sensitive paper having a mixture of a photosensitive agent and a developer applied onto its suriace, the photosensitive agent including microcapsules separately containing a coloring basic material of each of basic primary cyanic, magenta, and yellow colors, for color printing. The spectral sensitivity characteristic of the photosensitive and pressure-sensitive paper 135 is known, as shown in FIG. 2, such that peak sensitivities for cyanic, magenta, and yellow colors exist at respective wave lengths of 350 nm, 385 nm, and 470 nm, and therefore the spectro-filter 137 uses interference filters 141, 142, and 143 for cyanic, magenta, and yellow colors, the cyanic interference filter 141 being capable of transmitting only the light of 350 nm wave length for light-hardening the cyanic coloring basic material, the magenta interference filter 142 being capable of transmitting only the light of 385 nm wave length for light-hardening the magenta coloring basic material, and the yellow interference filter 143 being capable of transmitting only the light of 475 nm wave length for light-hardening the yellow coloring basic material. In the drawing, the reference numeral 144 designates pressure-fixing rolls and 145 a film stacker for accumulating used mask original form carrying films.

In the thus arranged color picture recording apparatus, color picture is carried out in such a manner that the red filter 128, the green filter 129, and the blue filter 130 which are constituent components of the visible radiation spectro-filter 127 are set in order, and the light reflected from the surface of the color original 121 which is irradiated with the light from the visible radiation source 123 is transmitted through the filters 128, 129, and 130 successively separately. Then, the mask original form forming film 125 (125a, 125b, and 125c) is exposed by the light transmitted successively through the filters 128, 129, and 130 and subject to developing and fixing processing to thereby produce the mask original form carrying film 134 (134a, 134b, and 134c). In that case, only the red light reaches the mask original-form forming film portion 125a because only the red light is transmitted through the red filter 128. Because it is necessary that the portion corresponding to the red light is made blank in the mask original-form carrying film portion 134a through the developing and fixing processing, a positive color film is used as the mask original form forming film 125. Accordingly, the mask original-form carrying film portions 134b and 134c are made blank at only the portions corresponding to the green light and the blue light respectively. The photosensitive and pressure-sensive paper 135 is exposed in such a manner that the light radiated from the light source 136 is successively and separately transmitted through the interference filters 141, 142, and 143 and the mask original-form carrying film portions 134a, 134b, and 134c, respectively, to the photosensitive and pressure-sensitive paper 135.

After completion of successive exposure by the respective basic primary cyanic, magenta, and yellow colors, the photosensitive and pressure-sensitive paper 135 is passed through a nip between the pressure-fixing rolls 144 and 144, so that of the microcapsules containing the coloring basic materials, those which have not been light-hardened are broken to thereby be subject to coloring and fixing processing. In this connection, the surface portion of the photosensitive and pressure-sensitive paper 135 on which only the cyanic coloring basic material has been light-hardened presents a red color because of synthesis of magenta and cyanic colors, the surface portion of the same on which only the magenta coloring basic material has been light-hardened presents a green color, and the surface portion of the same on which only the yellow coloring basic material has been light-hardened presents a blue color, so that desired color picture recording can be achieved. The mask original form carrying 134 is accommodated in the film stacker 145 so as to make it possible to produce the same picture recording again thereafter without using the original.

Although the photosensitive and pressure-sensitive paper of the self-coloring type is used in the embodiment, the invention is not limited to this but applicable to the photosensitive and pressure-sensitive paper of the transfer type. A developing sheet on which a developer agent has been applied is separately prepared. After exposed, the photosensitive and pressure-sensitive paper of the transfer type is passed through a nip between pressure-fixing rolls under the condition that the photosensitive and pressure-sensitive paper is superimposed on the developing sheet so that the microcapsules at the non-exposed surface portions of the photosensitive and pressure-sensitive paper are crushed by the rolls to thereby make the inside coloring basic material react with the developer agent on the developing sheet to develop a color picture on the developing sheet. Thus, the color picture recording can be performed. Further, in the color picture recording, dichroic picture recording with red and blue colors, with black and red colors, or the like, may be suitably performed. That is, in the process of the dichroic picture recording with red and blue colors, only the red and blue filters of the spectro-filter 137 are used, while in the process of the dichroic picture recording with black and red colors, the red filter is used in addition to an interference filter for transmitting light of all the wave lengths. In those cases, two mask original forms of the film 125 (134) are used. As to the photosensitive and pressure-sensitive paper 135 per se, some kinds of photosensitive and pressure-sensitive paper different in color-generation basic material are known, and photosensitive and pressure-sensitive paper additionally having microcapsules containing black-coloring basic material can be used to attain the same object.

Although the embodiment has been described about the case of color picture recording, the present invention is applicable to monochromatic picture recording. For example, if the light radiated from the light source 136 is directly passed through the mask original form carrying film 134 to expose the photosensitive and pressure-sensitive paper 135 without passing through the spectro-filter 137, it is possible to obtain a monochromatic picture from a color original or a monochromatic original. At that time, a single mask original form of the film 125 (134) is used in the case of making a picture from a monochromatic original.

Figure 12:
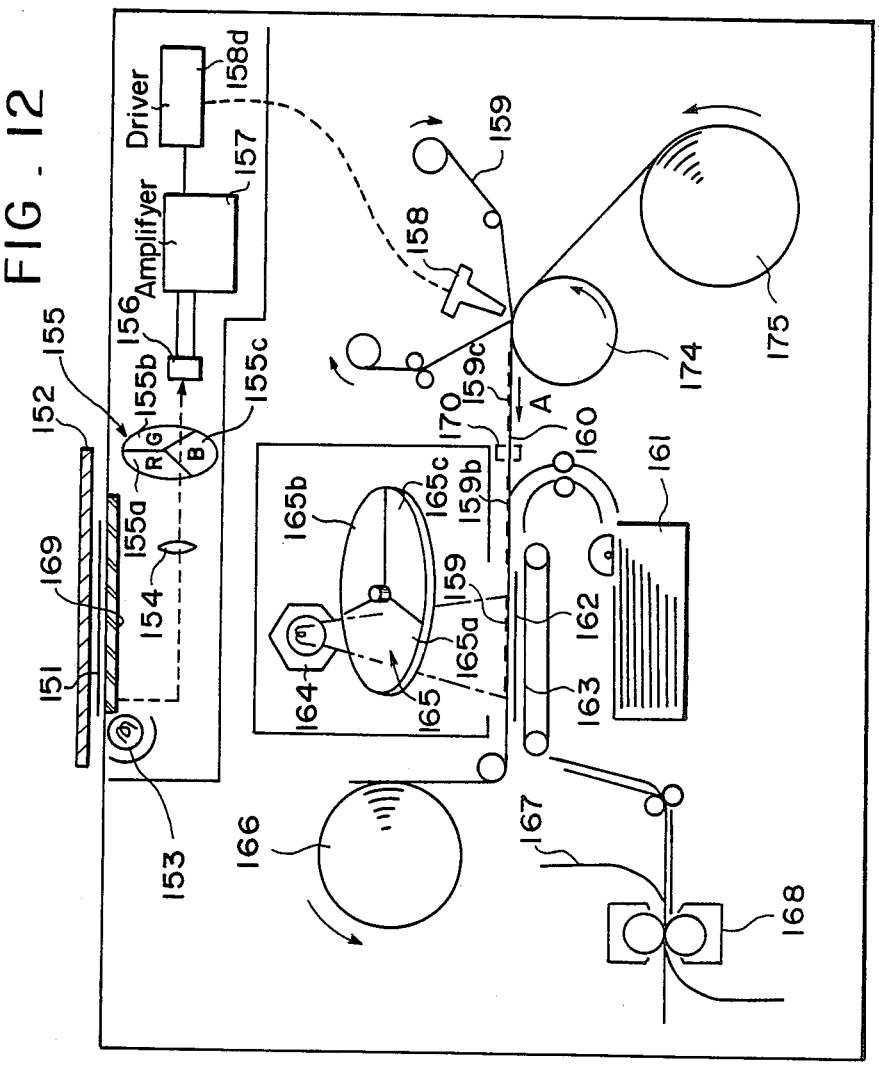
FIG. 12 is a schematic diagram showing a sixth embodiment of the present invention.

FIG. 12 shows a general structure of a picture recording apparatus for realizing color picture recording as a sixth embodiment according to the present invention. In the apparatus, an original 151 is disposed on an original stand 169 made of transparent glass and an original cover 152 is put over the original 151. A light-source lamp 153 for radiating light to light-scanning the surface of the original 151 is provided directly under the original stand 169. Further, a focusing lens 154, a tri-color separation filter 155, and a CCD 156 acting as a color image sensor are arranged in order as an optical system for the light which has scanned the surface of the original 151. The tri-color separation filter 155 is constituted by a red filter 155a for transmitting only red light, a green filter 155b for transmitting only blue light. The CCD 156 is connected to an amplifier 157 which is in turn connected to an impact head 158 such as a printing head of the wire-dot system through a driving circuit (driver) 158d. The impact head 158 is disposed in opposition to a platen 174, and a light-transmitting intermediate sheet 160 such as a resin film, a paper, or the like, and an ink ribbon 159 are laminated on each other and interposed between the platen 174 and the impact head 158. The intermediate sheet 160 is arranged such that the sheet 160 in the state like rolled paper is uncoiled from an uncoiler 175, fed between the platen 174 and the impact head 158 in the direction indicated by an arrow A in FIG. 12, and taken up onto a recoiler 166. An exposure stand 163 of the roll-conveyer type is disposed in opposition to the feed line of the intermediate sheet 160 and a photosensitive and pressure-sensitive paper 162 of the transfer type drawn out of a paper cassette 161 is set on the exposure stand 163. The photosensitive and pressure-sensitive paper 162 is of the type for color picture recording. That is, on the surface of the photosensitive and pressure-sensitive paper 162, cyanic microcapsules, magenta microcapsules, and yellow microcapsules in the state where they are uniformly mixed and dispersed, the cyanic microcapsules containing a coloring material of cyanic dye as a main part together with the balance of light-hardening resin, a light sensitizer, a light polymerization starting agent, etc., the magenta microcapsules containing a coloring material of magenta dye as a main part, the yellow microcapsules containing a coloring material of yellow dye as a main part. As shown in FIG. 12, a developing sheet 167 having a developer agent applied on the surface thereof is disposed on another line (which will be described later). An exposure lamp 164, such as a fluorescent lamp, a halogen lamp, or the like, for radiating white light is disposed at a position directly above the exposure stand 163, and a tri-color separation filter 165 is provided between the exposure lamp 164 and the exposure stand 163. The tri-color separation filter 165 is constituted by a red filter 165a for transmitting only light of a wave length for light-hardening the cyanic microcapsules (650 nm in the embodiment), a green filter 165b for transmitting only light of a wave length for light-hardening the magenta microcapsules (550 nm in the same), and a blue filter 165c for transmitting only light of a wave length for light-hardening the yellow microcapsules (459 nm in the same) so as to fit the respective spectral sensitivities of the microcapsules containing coloring materials of cyanic, magenta, and yellow colors applied onto the surface of the photosensitive and pressure-sensitive paper 162. A pressure developing device 168 for the photosensitive and pressure-sensitive paper 162 is provided in the vicinity of the exposure stand 163. The photosensitive and pressure-sensitive paper 162 which has been subject to predetermined exposure processing on the exposure stand 163 is laminated on the transfer sheet 167 drawn out of the above-mentioned other line, and sent together with the transfer sheet into the pressure developing device 168.

Next, the operation of the picture recording apparatus will be described.

First, the light-source lamp 153 is lit so that the surface of the original 151 is scanned by the light radiated from the light-source lamp 153, and the light which has scanned the surface of the original is focused on the surface of the CCD 156 through the focusing lens 154 and the tri-color separation filter 155. Accordingly, the image of characters, pictures, or the like on the surface of the original 151 is read by the CCD 156 as the intensity of light. Succeedingly, the image data read by the CCD 156 is converted into an electric signal which is in turn amplified by the amplifier 157 and transferred to the impact head 158. The impact head 158 is controlled so as to perform impact printing with non-light-transmitting ink of the ink ribbon 159 onto the surface of the intermediate sheet 160 fet at a fixed speed with respect to a part of range of the transferred image data where light was not sensed by the CCD 156. At that time, the tri-color separation filter 155 is successively switched to the red filter 155a, the green filter 155b, and the blue filter 155c in order so that the scanning light is radiated from the light-source lamp 153 every time the tri-color separation filter 155 is switched. In such a manner, only a cyanic image on the surface of the original 151 is transmitted through the red filter 155a so as to be read by the CCD 156 in the state where the red filter 155a is set, so that a positive film picture 159a printed with the non-light-transmitting ink in a region including the cyanic image is obtained on the surface of the intermediate sheet 160. Succeedingly, a positive film picture 159b printed with the non-light-transmitting ink with respect to the region including the magenta image on the original 151 is obtained in the state where the green filter 155b is set, and, similarly to this, a positive film picture 159c printed with the non-light-transmitting ink with respect to the region including the yellow image on the original 151 is obtained in the state where the blue filter 155c is set. The three thus obtained positive film pictures 159a, 159b, and 159c are put one by one on the photosensitive and pressure-sensitive paper 162 which has been previously set on the exposure stand 163. Accordingly, when the positive film picture 159a is put on the photosensitive and pressure-sensitive paper 162 first, the tri-color separation filter 165 has been previously set to the red filter 165a. When the exposure lamp 164 is lit, only the light of the wave length for light-hardening only the cyanic microcapsules on the photo-sensitive and pressure-sensitive paper 162 is transmitted through the cyanic positive-film picture 159a in the region where the non-light-transmitting ink was not printed so as to irradiate the photosensitive and pressure-sensitive paper 162, so that only the cyanic microcapsules in the irradiated region are selectively light-hardened. Succeedingly, when the magenta positive-film picture 159b is put on the photosensitive and pressure-sensitive paper 162, the tri-color separation filter 165 is set to the green filter 165b, and the exposure lamp 164 is lit, so that only the magenta microcapsules on the photosensitive and pressure-sensitive paper 162 in the region corresponding to the region of the magenta positive-film picture 159b where the non-light-transmitting ink is not printed are light-hardened. Similarly, when the yellow positive-film picture 159c is put on the photosensitive and pressure-sensitive paper 162, the tri-color separation filter 165 is set to the blue filter 165c, and the exposure lamp is lit, so that only the yellow microcapsules on the photosensitive and pressure-sensitive paper 162 in the region corresponding to the region of the yellow positive-film picture 159c where the non-light-transmitting ink is not printed are light-hardened. Thus, when predetermined exposure processing onto the three positive-film picture 159a, 159b, and 159c has completed, the photosensitive and pressure-sensitive paper 162 on the exposure stand 163 is sent out, put on the transfer sheet 167, and sent into the pressure developing device 168 together with the transfer sheet 167. Thus, not-hardened microcapsules on the photosensitive and pressure-sensitive paper 162 are broken by pressure, so that a picture is copied on the transfer sheet 167 owing to developing reaction of the coloring materials coming out of the broken microcapsules and the developer agent on the transfer sheet 167. Describing the process more specifically, in the region where only the cyanic microcapsules have been light-hardened, the magenta and yellow microcapsules are broken by pressure, so that a red color presents owing to subtractive color mixture of the magenta and yellow coloring materials. In the region where only the magenta microcapsules have been light-hardened, a green color presents owing to subtractive color mixture of the cyanic and yellow colors, and in the region where only the yellow microcapsules have been light-hardened a blue color presents owing to subtractive color mixture of the cyanic and magenta colors. When the original 151 has an image composed of black characters and/or pictures, the light is not reflected at the portion of the image and therefore not transmitted through any of the red, green, and blue filters 155a, 155b, and 155c, so that black characters and/or pictures are reproduced on the transfer sheet 167 owing to subtractive color mixture of the three, cyanic, magenta, and yellow colors. In that case, the coloring on the original 151 is reproduced, that is, full color is realized.

In the embodiment, as shown in an enlarged diagram of FIG. 13, there is provided positioning means for surely stopping each of the three positive-film pictures 159a, 159b, and 159c at a predetermined position on the exposure stand 163. That is, an electric-magnet driven perforator 170 is provided in opposition to the feed line of the intermediate sheet 160, and for detecting holes formed in the intermediate sheet 160 by the perforator 170, a pair of detecting-light sources 171 and a pair of light-receiving elements 172 are provided respectively in opposition to each other on the exposure stand 163 while sandwiching the intermediate sheet 160 therebetween. A driving source (not shown) for feeding the intermediate sheet 160 is connected to the light-receiving elements 172 through a differential amplifier 173. Thus, every time when a positive film picture is formed on the intermediate sheet 160 by the impact head 158, holes are formed in the positive film picture at a side thereof by the perforator 170. If the driving source for feeding the intermediate sheet 160 is arranged so as to be stopped as soon as the holes are detected by the light which is radiated from the detecting-light sources 171 and received by the light receiving elements 172, the positional displacement among the three positive film pictures 159a, 159b, and 159c can be surely prevented from occurring. Other than the way described above, the stoppage positioning mean for stopping the positive film picture in place may be realized in various ways. For example, dragonfly marks 176 are stamped by the impact head 158 as shown in FIG. 14 every time when a positive film picture is formed on the intermediate sheet 160, so that the dragonfly marks 176 are detected by the detecting light sources 171 and the light-receiving elements 172.

Figure 15:
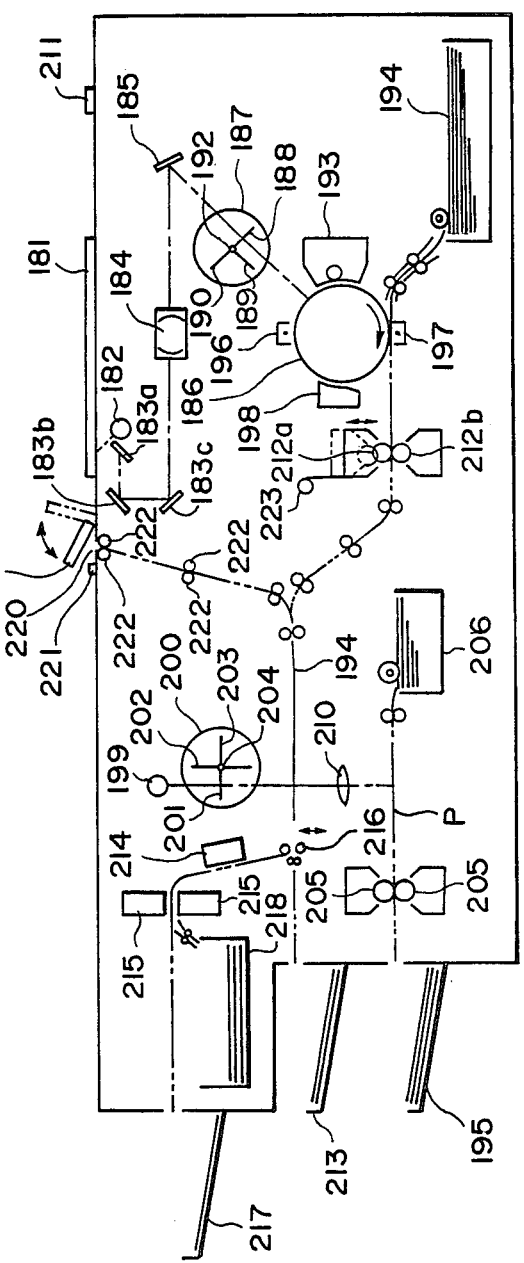
FIG. 15 is a schematic diagram of a color picture recording apparatus.

Referring to FIG. 15, a seventh embodiment according to the present invention will be described hereunder. In the drawings, the reference numeral 181 designates an original and 182 designates a visible light source disposed in opposition to a picture of the original 181. A light radiated from the visible light source 182 to the picture of the original 181 is reflected from the picture of the original 181 and the reflection light is caused to impinge onto a photosensitive drum 186 through a reflection mirrors 183, and optical lens 184, and a reflection mirror 185. The photosensitive drum 186 is formed by depositing a photosensitive film, such as a selenium layer, an alloy layer of selenium and tellurium, or the like, onto a surface of a drum substrate made of an electrically conductive material such as aluminium or the like and is arranged to be rotated in the direction indicated by an arrow in FIG. 15. The reference numeral 187 designates a visible radiation spectro-filter disposed in an optical system between the optical lens 184 and the reflective mirror 185. The visible radiation spectro-filter 187 is constituted by a red filter 188 for transmitting only red light, a green filter 189 for transmitting only green light, and a blue filter 190 for transmitting only blue light. Those filters are arranged to radially extend about a rotary shaft 192. The reference numeral 193 designates a toner-development device disposed in opposition to the photosensitive drum 186 and provided with only one kind of, that is, black toners, 194 a sheet-like light transmitting film arranged to be moved at the same constant speed as the rotary speed of the photosensitive drum 186 in the direction indicated by the arrow in the drawing while being made to be in close opposition to the surface of the photosensitive drum 186 in the way of movement. The reference numeral 196 designates a corotron provided in opposition to the photosensitive body 186 at a position on this side with respect to the rotating direction from a point where the surface of the photosensitive drum is irradiated with the reflection light for charging the photosensitive drum 186 to thereby attach the black toners onto the surface of the photosensitive drum 186, the reference numeral 197 designates another corotron provided in opposition to the photosensitive drum 186 with the light transmitting film 194 sandwiched therebetween for transferring the black toners on the surface of the photosensitive drum 186 onto the light transmitting film 194, and the reference numeral 198 designates a discharge device for discharging the photosensitive drum 186 after the black toners on the surface of the photosensitive drum 186 have been transferred onto the light transmitting film 194. The reference numerals 212a and 212b designate a pair of fixing rolls provided for performing fixing processing of the light transmitting film 194 onto which the black toners have been transferred from the surface of the photosensitive drum 186, a driving device 223 being connected to one of the fixing rolls 212a so that the fixing rolls 212a and 212b can leave away from come close to each other. The reference numeral 211 designates a changeover switch for switching the driving device. A coping portion is provided at a position on this side with respect to the moving direction of the light transmitting film 194, so that photosensitive and pressure-sensitive paper P can be set under the light transmitting film 194 at the recording portion. Further, an exposure light source 199 is disposed above the photosensitive and pressure-sensitive paper P, and a spectro-filter 200 and an optical lens 210 are disposed in an optical system between the exposure light source 199 and the light transmitting film 194. In this case, the above-mentioned photosensitive and pressure-sensitive paper p may be known photosensitive paper carrying on its surface a light-hardening sensitizer composed of microcapsules separately containing coloring basic materials primary cyanic, magenta, and yellow colors for use color printing together with a developer agent. FIG. 2 shows the spectral sensitivity characteristics of the above-mentioned photosensitive and pressure-sensitive paper P. It is known that the respective peak sensitivities of cyanic, magenta, and yellow colors exist at the wave-lengths of 350 nm, 385 nm, and 475 nm. Accordingly, the spectro-filter 200 is constituted by an interference filter 201 for the cyanic color for transmitting only the light of the wave-length of 350 nm so as to make the cyanic coloring basic material harden by light, another interference filter 202 for the magenta color for transmitting only the light of the wave-length of 385 nm so as to make the magenta coloring basic material harden by light, and a further interference filter 203 for the yellow color for transmitting only the light of the wave-length of 475 nm so as to make the yellow coloring basic material harden by light, as shown in FIG. 3, the filters 201, 202, and 203 being arranged to radially extend around the rotary shaft 204. In the drawing, the reference numerals 205 and 205 designate a pair of heat fixing rolls for the photosensitive and pressure-sensitive paper P. '206 designates a storage/feed portion for the photosensitive and pressure-sensitive paper P, and 195 designates a tray for accommodating copied materials obtained by causing the photosensitive and pressure-sensitive paper P to pass between the heat fixing rolls 205 and 205.

The reference numeral 216 designates change-over rolls provided so as to make it possible to change the transporting direction of the light transmitting film 194 after the exposure processing for the photosensitive and pressure-sensitive paper P has been completed. A cleaner 214 is provided on the transporting line for the light transmitting film 194 which has been subject to the above-mentioned toner fixing processing, and a tray 218 is provided at the end of the light transmitting film transporting line for collecting the light transmitting film 194 from which the toners have been removed. The reference numerals 215 and 215 designate light sensors such as photo-couplers provided on the transporting line so as to sense the light-transmittivity of the light transmitting film 144 from which the toners have been removed by the cleaner 214. The light transmitting film 194 which is determined to be cleaned once more as the result of detection by the light sensors 215 and 215 is led to an exhaust tray 217. The reference numeral 213 designates a film preserving tray provided at the end of the transporting line for the light transmitting film 194 which has been subject to the toner fixing processing.

Referring to FIG. 15, the reference numeral 220 designates an insertion opening for the light transmitting film 194 which has been subject to the toner fixing processing and which is used to carry out picture recording from the light transmitting film 194 once more, 219 designates a cover for opening/closing the insertion opening 220, 222 designates rolls for transporting the light-transmitting film 194, and 221 designates a switch for driving the transporting rolls 222. If the switch 221 is turned on, the light transmitting film 194 inserted into the insertion opening 220 is led to the above-mentioned copying portion.

When copying is to be made by the use of the thus arranged picture recording machine, the change-over switch 211 is set in a preservation mode if it is desired to preserve the light transmitting film 194 which has been used in picture recording. Then, the red filter 188, the green filter 189, and the blue filter 190 constituting the visible radiation spectro-filter 187 are successively set in order, and the reflected light from the picture of the color original 181 irradiated with the light from the visible light source 182 is transmitted successively through the respective filters 188, 189, and 190, so that electrostatic latent images presented by the transmitted light successively through the filters 188, 189, and 190 are successively formed on the photosensitive drum 186. The electrostatic latent images are successively developed by the toner-development device 193 and then transferred onto the light transmitting film 194. In this case, only the red light can be transmitted through the red filter 188, and therefore a portion of the photosensitive drum 186 other than the portion of the same irradiated with the red light is kept in a charged state so that the black toners are made to adhere onto only the charged portion of the photosensitive drum 186 and then transferred onto the light transmitting film 194 with only the portion corresponding to the red light kept blank. In the case of the green filter 189, the black toners are transferred onto the light transmitting film 194 with only the portion corresponding to the green light kept blank, and in the case of the blue filter 190, the black toners are transferred onto the light transmitting film 194 with only the portion corresponding to the blue light kept blank. The light transmitting film 194 on which the black toners have been transferred in such a manner as described above is advanced so as to be subject to pressure-fixing processing when passed between the fixing rolls 212a and 212b, and then irradiated with light from the exposure light source 199 first when the film portion where the black toner have been transferred by the use of the red filter 188 is located in opposition to the photosensitive and and pressure-sensitive paper P. At that time, the spectro-filter 200 is set to the interference filter 201 so that only the light of the wavelength of 350 nm can be transmitted through the cyanic interference filter 201. In this manner, the transmitted light passes through the portion of the light transmitting film 194 where no toners are attached and makes a light-hardening reaction only with the cyanic coloring basic material on the photosensitive and pressure-sensitive paper P to thereby expose only the portion of the photosensitive and pressure-sensitive paper P. At that time, it is a matter of course that the photosensitive and pressure-sensitive paper P is moved together with the light transmitting film 194 at the same speed with each other. Thus, upon completion of exposure onto the portion of the light transmitting film 194 corresponding to the red filter 188, the photosensitive and pressure-sensitive paper P is caused to come back to the initial position and another portion of the light transmitting film 194 corresponding to the succeeding green filter 189 is made to be in opposition to the photosensitive and pressure-sensitive paper P so as to be irradiated with ultraviolet light from the exposure light source 199. At that time, the spectro-filter 202 is set to the magenta interference filter 200 so that only the magenta coloring basic material on the photosensitive and pressure-sensitive paper P is subject to light-hardening reaction to thereby be exposed. Similarly to this, the yellow interference-filter 203 is set and the yellow coloring basic material on the photosensitive and pressure-sensitive paper P is subject to light hardening reaction to thereby expose the portion corresponding to the blue filter 190. After completion of exposure processing for the respective cyanic, magenta and yellow primary colors in such a manner as described above, the photosensitive and pressure-sensitive paper P is made to pass through a nip between the heat fixing rolls 205 and 205, so that the microcapsules of coloring basic materials which have not been hardened by light are broken, thereby performing coloring fixing processing of the photosensitive and pressure-sensitive paper P. In this connection, a red color presents due to synthesis of the magenta and cyanic colors on the photosensitive and pressure-sensitive paper P at a portion where only the cyanic coloring basic material is hardened by light, a green color presents at a portion where only the magenta coloring basic material is hardened by light, and a blue color presents at a portion where only the yellow coloring basic material is hardened by light, so that color copying with desired colors can be performed. Upon completion of the copying operation, the light transmitting film 194 is accommodated in the film-preserving tray 213.

On the other hand, when the light transmitting film 194 used in the picture recording process is not necessary to be preserved, the change-over switch 211 is set to a reproduction mode. Then, the fixing rolls 212a and 212b are separated from each other and at the same time the changeover rolls 216 are switched to the transporting line connected to the collecting tray 218. Therefore, the light transmitting film 194 is used to perform picture recording without being subject to fixing processing when passed between the fixing rolls 212a and 212b. Then, the light-transmitting film 194 is accommodated in the collecting tray 218 after the toners thereon has been cleaned by the cleaner 218.

What is claimed is:

1. A method of recording a picture onto a photosensitive and pressure-sensitive sheet, comprising the steps of:
   first forming a mask original form based on picture information entered through an input means which electronically emulates said picture so that said mask original form has a light-transmitting portion and a non-light-transmitting portion corresponding to picture information of said original picture;
   thereafter exposing the photosensitive and pressure-sensitive sheet to a light source through said mask original form to thereby form a latent image on said photosensitive and pressure-sensitive sheet; and
   thereafter pressing said photosensitive and pressure-sensitive sheet carrying the latent image formed thereon.

2. A picture recording method according to claim 1 comprising the further steps of:
   separately forming at least one additional mask original form based on said picture information;
   said mask original forms being successively and separately formed through said input means by selectively transmitting light waves of different lengths; and,
   exposing the same photosensitive and pressure-sensitive sheet successively through the mask original forms by selectively transmitting light waves of said different wavelengths.

3. A picture recording method according to claim 2, in which said multiple mask original forms are formed successively for cyanic, magenta, and yellow colors.

4. A picture recording method according to claim 1, in which said mask original form forming step includes the steps of:
   irradiating a photosensitive body with light on the basis of said picture information entered through said input means to thereby form a latent image on said photosensitive body;
   applying toners to said latent image on said photosensitive body; and
   transferring the toners on said photosensitive body onto a light-transmitting film to thereby record the picture on said film.

5. A picture recording method according to claim 1, in which said mask original form forming step includes the step of forming a mask original form for each of image data respectively for different colors of said picture information entered through said input means.

6. A method of recording a picture onto a photosensitive and pressure-sensitive sheet, comprising the steps of:
   forming a latent image on a medium with light transmitted through a visible radiation spectro-filter for transmitting specific color light parts of reflected light from an original picture irradiated with light;
   developing and fixing said medium to selectively partly have light transmission property to thereby prepare a mask original form having a light-transmitting portion and a non-light-transmitting portion corresponding to picture information of said original picture;
   exposing the photosensitive and pressure-sensitive sheet through said mask original form to thereby form a latent image on said photosensitive and pressure-sensitive sheet; and
   pressing said photosensitive and pressure-sensitive sheet carrying the latent image formed thereon.

7. A method of recording a picture onto a photosensitive and pressure-sensitive sheet, comprising the steps of:
   scanning an original picture with a visible light source;
   forming an electrostatic latent image on a photosensitive body corresponding to picture information of said scanned original picture;
   applying toners onto said photosensitive body;
   transferring the toners from said photosensitive body onto a surface of a light-transmitting film to thereby form a mask original form;
   exposing the photosensitive and pressure-sensitive sheet through said mask original form to thereby form a latent image on said photosensitive and pressure-sensitive sheet; and
   pressing said photosensitive and pressure-sensitive sheet carrying the latent image formed thereon.

8. A method of recording a picture onto a photosensitive and pressure-sensitive sheet, comprising the steps of:
   reading picture information of an original picture;
   transferring non-light-transmitting ink onto a light-transmitting film in accordance with the read picture information to thereby prepare a mask original form;
   exposing the photosensitive and pressure-sensitive sheet through said mask original form to thereby form a latent image on said photosensitive and pressure-sensitive sheet; and
   pressing said photosensitive and pressure-sensitive sheet carrying the latent image formed thereon.

9. A method of recording a picture onto a photosensitive and pressure-sensitive sheet, comprising the steps of:
   reading picture information of an original picture;
   heating a light-transmitting thermal sheet in accordance with the read picture information to form light shading image on said thermal sheet to thereby prepare a mask original form;
   exposing the photosensitive and pressure-sensitive sheet through said mask original form to thereby form a latent image on said photosensitive and pressure-sensitive sheet; and
   pressing said photosensitive and pressure-sensitive sheet carrying the latent image formed thereon.

10. A picture recording method according to claim 4 further comprising the step of selecting whether the toners are to be fixed onto said light-transmitting film or not.

11. A picture recording method in accordance with claim 7 further comprising the step of selecting whether the toners are to be fixed onto said light-transmitting film or not.

* * * * *